US008059205B2

(12) United States Patent
Nakakuki

(10) Patent No.: US 8,059,205 B2
(45) Date of Patent: Nov. 15, 2011

(54) IMAGE SIGNAL PROCESSING APPARATUS AND IMAGE SIGNAL PROCESSING METHOD FOR CONTROLLING OPTICAL BLACK LEVEL OF IMAGE SIGNAL

(75) Inventor: Toshio Nakakuki, Gifu (JP)

(73) Assignees: Sanyo Semiconductor Co., Ltd. (JP); Semiconductor Components Industries, LLC (JP)

(*) Notice: Subject to any disclaimer, the term of this patent is extended or adjusted under 35 U.S.C. 154(b) by 1118 days.

(21) Appl. No.: 11/843,728

(22) Filed: Aug. 23, 2007

(65) Prior Publication Data

US 2008/0055472 A1 Mar. 6, 2008

(30) Foreign Application Priority Data

Aug. 30, 2006 (JP) ................................. 2006-233500

(51) Int. Cl.
*H04N 5/18* (2006.01)
*H04N 5/16* (2006.01)
(52) U.S. Cl. ........ 348/689; 348/691; 348/695; 348/257; 348/572; 348/571

(58) Field of Classification Search .................. 348/257, 348/246, 247, 251, 689, 691, 682, 690, 695, 348/688, 572, 571
See application file for complete search history.

(56) References Cited

U.S. PATENT DOCUMENTS 6,580,465 B1 * 6/2003 Sato .............................. 348/689
2005/0157214 A1 7/2005 Takahashi et al.

FOREIGN PATENT DOCUMENTS

| JP | 2000-13637 | 1/2000 |
| JP | 2005-150802 | 6/2005 |

* cited by examiner

*Primary Examiner* — Jefferey Harold
*Assistant Examiner* — Jean W Desir
(74) *Attorney, Agent, or Firm* — Cantor Colburn LLP

(57) ABSTRACT

An image signal processing apparatus includes a clamp circuit that clamps an image signal having a horizontal synchronization signal, an optical black level period representing an optical black level, and an effective signal period representing an image signal for one horizontal line so as to clamp a value offset from the image signal on the basis of a first reference value during the optical black level period and to clamp the image signal on the basis of a second reference value different from the first reference value during the effective signal period, and a level computation circuit that determines the second reference value on the basis of a signal level clamped during the optical black level period.

8 Claims, 7 Drawing Sheets

IMAGE SIGNAL PROCESSING APPARATUS AND IMAGE SIGNAL PROCESSING METHOD FOR CONTROLLING OPTICAL BLACK LEVEL OF IMAGE SIGNAL

CROSS-REFERENCE TO RELATED APPLICATION

The complete disclosure of Japanese Patent Application No. 2006-233500 filed on Aug. 30, 2006, including the specification, claims, drawings, and abstract is incorporated herein by reference in its entirety.

BACKGROUND OF THE INVENTION

1. Field of the Invention

The present invention relates to an image signal processing apparatus and an image signal processing method for controlling the optical black level of an image signal.

2. Description of the Related Art

The optical black level of an image signal obtained by an image capturing device (imaging device) can vary according to the intensity of the light received by the device. Such being the case, in the case of a CCD (Charge Coupled Device) solid state image capturing device, a light-shielded pixel region, that is, an optical black (OPB) region, is commonly provided along the outer edge of the effective pixel region in the image capture unit so as to perform processing to clamp the reference level representing the optical black level of an image on the basis of an optical black signal (OPB signal) obtained correspondingly to this OPB region. Also, in an output of an AGC (Auto Gain Control) circuit provided at a subsequent stage, the optical black level of the image signal can vary according to the gain set therein. A clamp circuit to control the optical black level is therefore commonly provided in the subsequent stage of the AGC circuit.

During clamp processing of the optical black level in the related art as is shown in FIG. 6, the final reference optical black level is found by clamping the reference optical black level within the clamp range in the vicinity of the low reference side (L side, which is often on the high voltage side of an image signal in voltage) in the clamp region of an analog-to-digital converting circuit in analog processing, and by applying low-pass filter processing to the reference optical black level in the following digital processing. A desired imaging signal level can be obtained by subtracting the reference optical black level from an imaging signal.

The reference optical black level clamped during analog processing, however, may vary due to noise superimposed on the imaging signal. Hence, when the level to be clamped is adjusted to the low reference side in the clamp region of the analog-to-digital converting circuit, as is shown in FIG. 7, noise below the low reference (that is, exceeding the high voltage limit of the clamp region) is clipped by the analog-to-digital converting circuit in the optical black portion, making it impossible to determine a precise optical black level in the digital processing in the subsequent stage.

SUMMARY OF THE INVENTION

In one aspect, the present invention provides an image signal processing apparatus for applying processing to an image signal having a synchronization period, an optical black level period representing an optical black level, and an effective signal period representing an image signal, including a clamp circuit that clamps a value offset from the image signal on the basis of a first reference value during the optical black level period and clamps the image signal on the basis of a second reference value different from the first reference value during the effective signal period, wherein the second reference value is determined based upon a signal level clamped during the optical black level period.

According to another aspect, the present invention provides an image signal processing method for applying processing to an image signal having a synchronization period, an optical black level period representing an optical black level, and an effective signal period representing the image signal, including performing first clamp processing to clamp the image signal in the optical black level period by offsetting the image signal on the basis of a first reference value, performing second clamp processing to clamp the image signal in the effective signal period on the basis of a second reference value different from the first reference value, and performing reference value calculation processing to determine the second reference value on the basis of a signal level clamped by the first clamp processing.

DESCRIPTION OF THE PREFERRED EMBODIMENT

Figure 1:
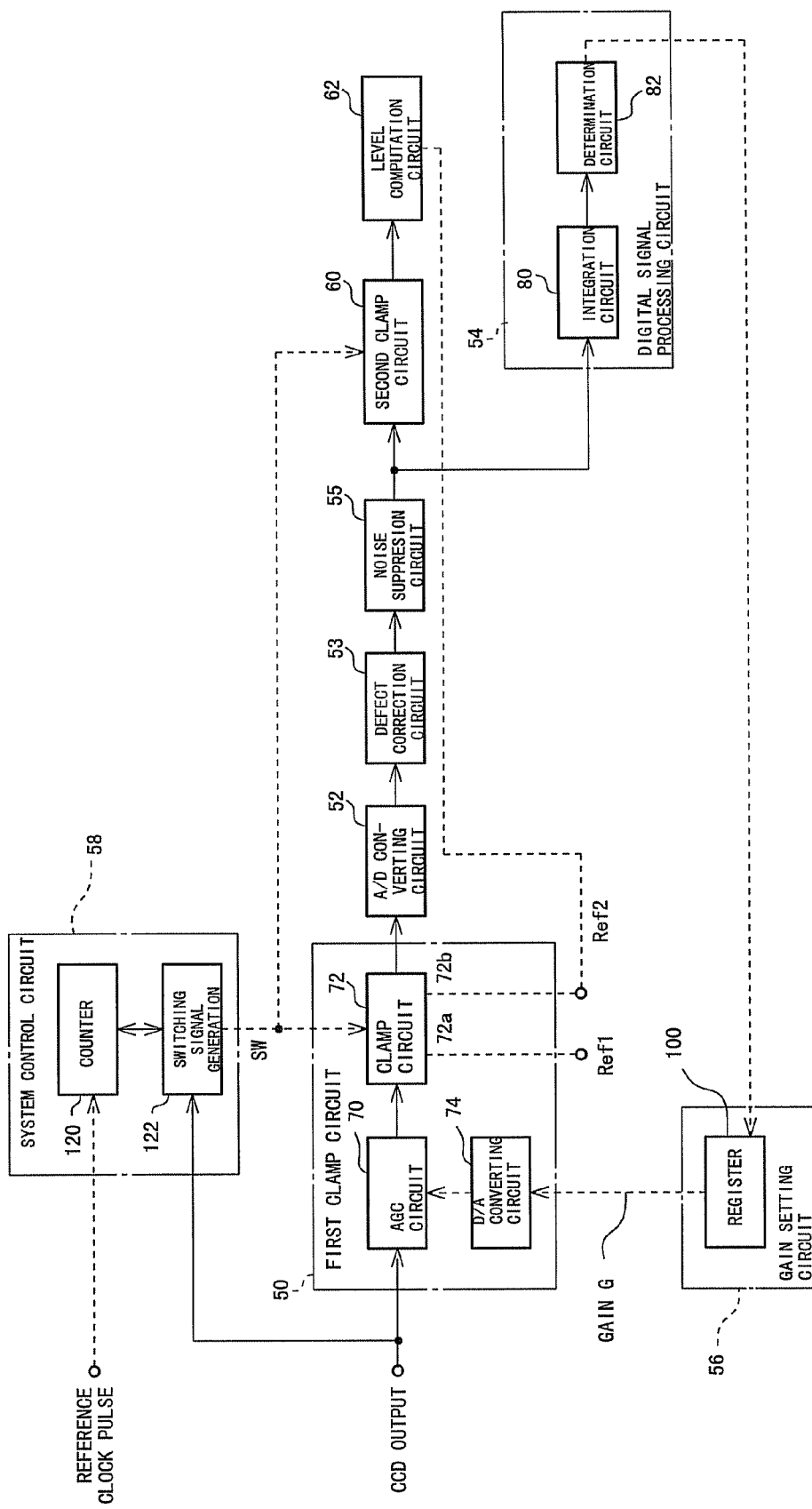
FIG. 1 is a block diagram showing the configuration of an image signal processing apparatus according to one embodiment of the present invention.

As is shown in FIG. 1, an image signal processing apparatus according to one embodiment of the present invention is formed by including a first clamp circuit 50, an analog-to-digital (A-to-D) converting circuit 52, a defect correction circuit 53, a noise suppression circuit 55, a digital signal processing circuit 54, a gain setting circuit 56, a system control circuit 58, a second clamp circuit 60, and a level computation circuit 62.

The system control circuit 58 includes a counter 120 and a switching signal generation circuit 122. The switching signal generation circuit 122 outputs a switching signal SW to a clamp circuit 72 included in the first clamp circuit 50 using a counter 120. FIGS. 2A through 2G show timing charts when the switching signal SW is generated in the system control circuit 58 and the reference level of an image signal is clamped in the clamp circuit 72.

Figure 2:
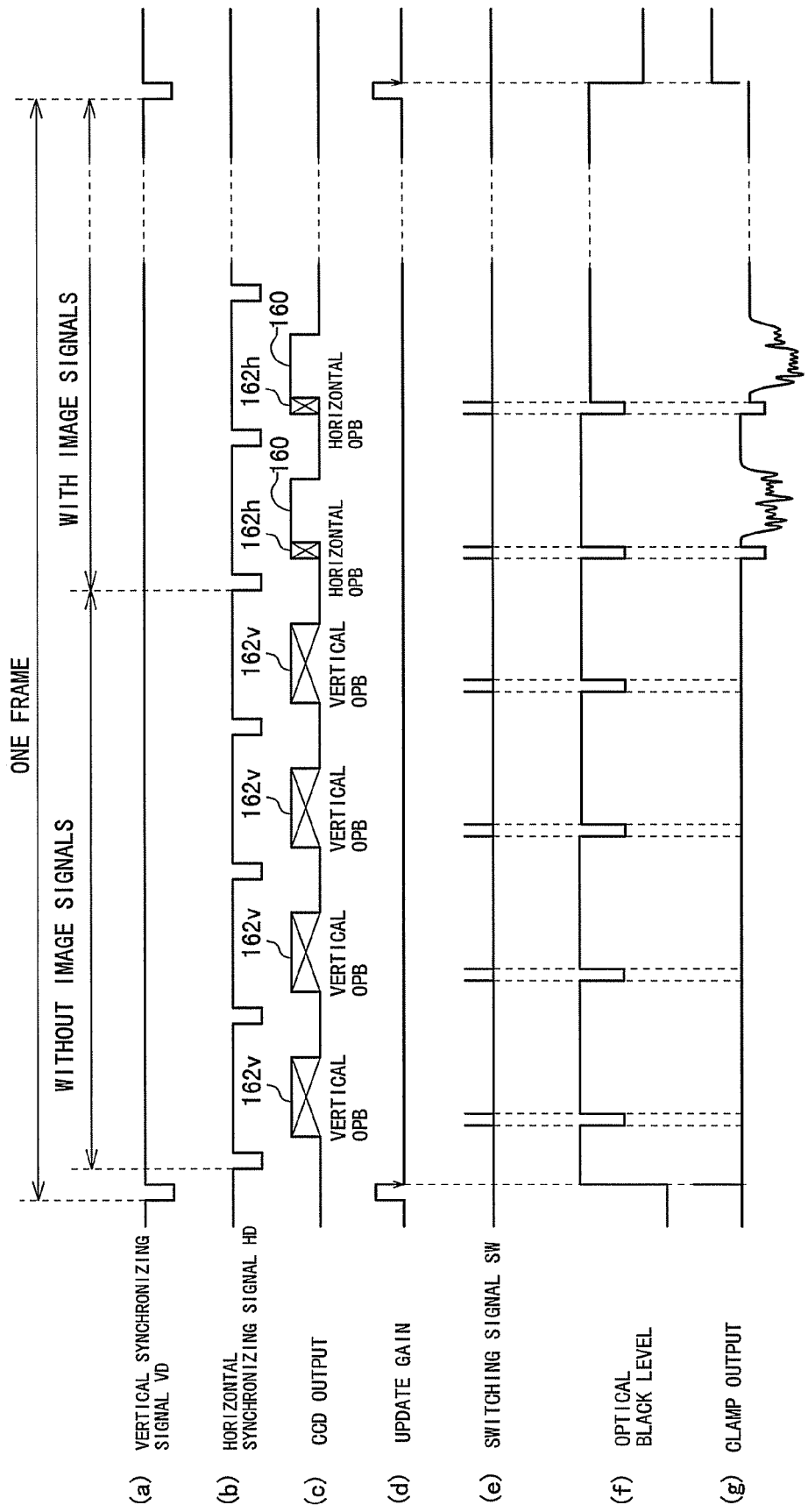
FIGS. 2A through 2G are views showing the timing charts in an image signal processing method according to the embodiment of the present invention.

Image signals are formed continuously frame by frame. As shown in FIGS. 2A through 2C, image signals for one frame are made up of plural image signals, each of which corresponds to one horizontal line delimited by a horizontal synchronizing signal HD. The header of a each image signal frame includes a vertical synchronizing signal VD to specify the delimitation of the image signals between frames. An image is played back by switching frames in sync with each vertical synchronizing signal VD and by horizontally scanning the image signals per horizontal line while performing vertical scanning in sync with each horizontal synchronizing signal HD.

Figure 3:
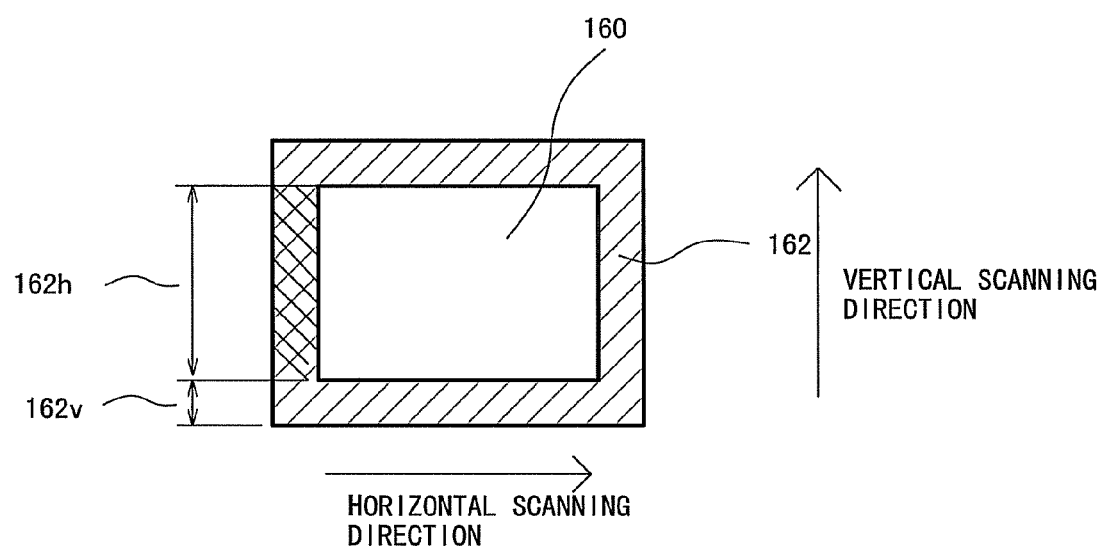
FIG. 3 is a view showing an example of the configuration of an image capturing device having an optical black region and an effective pixel region.

As is shown in FIG. 3, the image capturing device is provided with an effective pixel region 160 in which photoelectric converting elements are arrayed so as to receive light from the outside and an optical black (OPB) region 162 in which light-shielded photoelectric converting elements are arrayed so as not to receive light from the outside. Hence, as shown in FIGS. 2A through 2C, an output signal from the image capturing device includes a period, following the vertical synchronizing signal VD, from which actual image signals are absent because of vertical optical black signals for plural horizontal lines obtained correspondingly to a vertical optical black region 162v, which is a part of the OPB region 162. Each of the vertical optical black signals is delimited by the horizontal synchronizing signal HD for every horizontal line. Thereafter, image signals for plural horizontal lines continue, each of these having a horizontal optical black period that corresponds to a horizontal optical black region 162h, which is a part of the OPB region 162, and an effective signal period that includes an effective image signal substantially containing image information and obtained corresponding to the effective pixel region 160. Both the horizontal optical black period and the effective signal period are delimited by the horizontal synchronizing signal HD for every horizontal line. The OPB signals obtained corresponding to the vertical optical black region 162v and the horizontal optical black region 162h are used to determine the optical black level of an image signal.

The timing to clamp the horizontal optical black signal obtained in the horizontal optical black region 162h and the timing to clamp the signal during the subsequent effective image signal period are determined by inputting a reference clock pulse signal at a specific frequency into the counter 120 to count the number of pulses. The switching signal SW is output at the timing thus determined.

More specifically, upon receipt of the horizontal synchronizing signal HD of an image signal, the switching signal generation circuit 122 resets the value in the counter 120. After being reset, the counter 120 increments the count value in unit increments, each time the pulse in the reference clock pulse signal increases. As shown in FIG. 2E, the switching signal generation circuit 122 outputs the switching signal SW when the counter 120 counts pulses in the reference clock pulse signal equal to a number corresponding to the time from the horizontal synchronizing signal HD to the start of the horizontal optical black signal. Further, the switching signal generation circuit 122 again outputs the switching signal SW when the counter 120 counts pulses in the reference clock pulse signal equal to a number corresponding to the time from the horizontal synchronizing signal HD to the start of the effective image signal period. The switching signal SW is input into the clamp circuit 72 and the second clamp circuit 60.

The first clamp circuit 50 includes an AGC circuit 70, the clamp circuit 72, and a digital-to-analog (D-to-A) converting circuit 74. The AGC circuit 70 receives an image signal (imaging signal) from the image capturing device, such as a CCD solid state image capturing device, and amplifies the image signal in response to the gain G provided from the gain setting circuit 56. The clamp circuit 72 is a circuit that clamps the optical black level of the image signal amplified in the AGC circuit 70. More specifically, the clamp circuit 72 is formed by including a reference voltage source and a switch that connects the reference voltage source to an image signal line. The timing the clamping of the optical black level and the effective signal level of an image signal in the clamp circuit 72, that is, the clamp timing, is set by the system control circuit 58.

The clamp circuit 72 is provided with reference setting terminals 72a and 72b. Reference values Ref1 and Ref2, which are used as the references when clamping the optical black level and the effective signal level of an image signal, are input into the reference setting terminals 72a and 72b, respectively. The clamp circuit 72 makes a switching between the reference value Ref1 input into the reference setting terminal 72a and the reference value Ref2 input into the reference setting terminal 72b each time it receives the switching pulse SW from the system control circuit 58, and clamps the signal on the basis of the switched value by using it as the clamp reference (low reference value).

Figure 4:
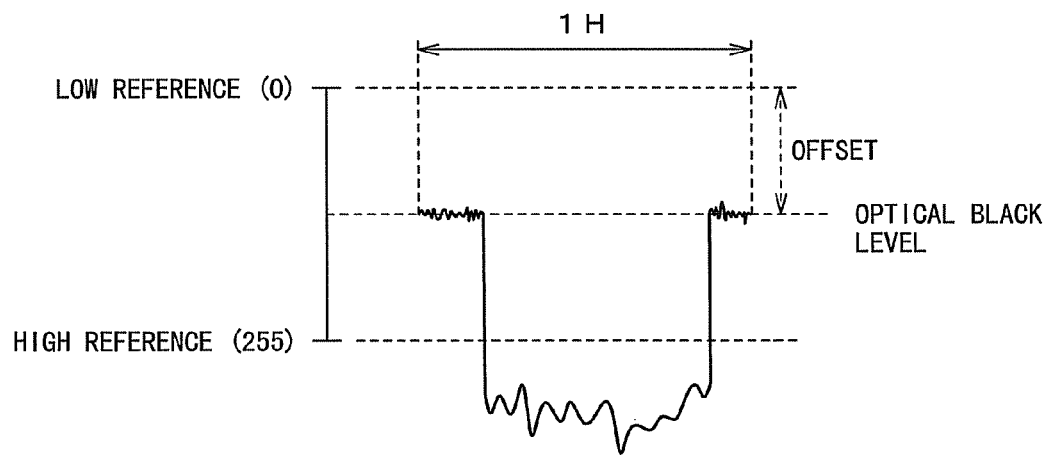
FIG. 4 is a view used to describe clamp processing during an optical black level period (horizontal optical black period) according to the embodiment of the present invention.

A fixed voltage value obtained by dividing the power supply voltage by a device, such as a variable resistor, is set at the reference setting terminal 72a as the reference value Ref1. As shown in FIG. 4, the reference value Ref1 is set in such a manner that a signal in the vicinity of the optical black level which does not fluctuate markedly is clamped in the vicinity of the midpoint of the dynamic range of the A-to-D converting circuit 52. More specifically, as shown in FIGS. 2F and 2G, during the period corresponding to the horizontal optical black region 162h, an image signal is offset from the low reference value by a voltage value corresponding to the reference value Ref1 and clamped as the optical black level. Meanwhile, a voltage value from the level computation circuit 62 is input into the reference setting terminal 72b as the reference value Ref2. The reference value Ref2 is adjusted to enable a usable signal that fluctuates relatively widely to use the dynamic range of the A-to-D converting circuit 52 as effectively as possible. As is shown in FIG. 2G, during the effective signal period, the image signal included in the effective signal period is clamped on the basis of the reference value Ref2 and subjected to processing. The setting of the reference value Ref2 will be described below.

The image signal for which the optical black level has been adjusted in the clamp circuit 72 is input into the A-to-D converting circuit 52. The A-to-D converting circuit 52 converts the image signal in the form of an analog signal into a digital signal and outputs the digital image signal. The digital image signal is output to the defect correction circuit 53. In the defect correction circuit 53, the digital image signal is corrected using processing, such as interpolation to replace a portion of the signal missing as a result of processing in the preceding stage at the time of reception and transmission. After any noise in the digital image signal output from the defect correction circuit 53 is suppressed by the noise suppression circuit 55, the digital image signal is output to the digital signal processing circuit 54 and the second clamp circuit 60.

The digital signal processing circuit 54 is configured to perform various types of image processing in addition generation processing of a luminance signal and a color-difference signal of a digital image signal upon receipt of the digital image signal. Among configurations enabling various kinds of processing, FIG. 1 shows an integration circuit 80 and a determination circuit 82 involved in the feedback control of the gain in the image signal processing apparatus of this embodiment. The integration circuit 80 determines, for example, an integrated value of image signals for one frame. The determination circuit 82 compares the integrated value obtained in the integration circuit 80 with a specific target range, and determines to increase the gain when the integrated value is lower than the target range, to decrease the gain when the integrated value exceeds the target range, and to maintain the current gain intact when the integrated value is within the target range. The determination result generated in the determination circuit 82 is sent to the gain setting circuit 56. The integrated value obtained in the integration circuit 80 can be used for auto iris control as an example of the various kinds of signal processing mentioned above.

Upon receipt of the determination result, the gain setting circuit 56 sets the gain G in the AGC circuit 70. The gain setting circuit 56 outputs the gain G to the D-to-A converting circuit 74 in sync with the vertical synchronizing signal VD that accompanies the image signals. Because the vertical synchronizing signal VD is a signal specifying the switching timing of image signals for one frame, the gain G in the AGC circuit 70 is updated for the image signals for every frame.

The gain setting circuit 56 is provided with a register 100. The register 100 pre-stores several types of gain values for the AGC circuit 70, in order that it may selectively output one of the pre-stored gain values according to the received determination result. For example, the gain setting circuit 56 may save the address in the register 100 at which the gain value selected last time is stored, and, in a case wherein the desired result is to increase the gain G, gain setting circuit 56 may specify an address at which is stored again value larger than the gain value stored at the saved address and outputs the gain value stored at the specified address. Conversely, in a case wherein the determination result is to decrease the gain G, it specifies an address at which is stored a gain value smaller than the gain value stored at the saved address and outputs the gain value stored at the specified address. When the desired determination result is to maintain the current gain G intact, gain setting circuit 56 either outputs a gain value by reading out the gain value stored at the saved address, or outputs the current gain value intact by omitting a reading operation.

The gain G is output from the gain setting circuit 56 in the form of a digital value. Upon receipt of the gain G, the D-to-A converting circuit 74 converts the value thereof in the digital form to the analog form, and outputs the resulting value to the AGC circuit 70. As described above, the AGC circuit 70 amplifies the image signal in response to the gain G converted in the analog form. In this manner, the intensity of the image signal is adjusted according to the dynamic range for digitization in the A-to-D converting circuit 52.

Upon receipt of the signal from the noise suppression circuit 55, the second clamp circuit 60 performs second clamp processing by digital processing. The second clamp circuit 60 switches between a state where the signal input therein from the A-to-D converting circuit 52 is clamped and a state where the signal is not clamped each time it receives the switching signal SW from the system control circuit 58. More specifically, second clamp circuit 60 begins clamping upon receipt of the switching signal SW output from the switching signal generation circuit 122 at a timing at which the counter 120 has counted a number of pulses in the reference clock pulse signal equal to a number corresponding to the time from the horizontal synchronizing signal HD to the start of the horizontal optical black signal, and stops clamping upon receipt of the switching signal SW output from the switching signal generation circuit 122 at a timing at which the counter 120 has counted pulses in the reference clock pulse signal equal to a number corresponding to the time from the horizontal synchronizing signal HD to the start of the effective image signal period. It is thus possible to clamp a signal in just the horizontal optical black period (optical black level period).

The second clamp circuit 60 temporally smoothes (levels off) a signal input therein from the A-to-D converting circuit 52 in the digital form during the horizontal optical black period and clamps the resulting signal, which is output to the level computation circuit 62.

The level computation circuit 62 generates the reference value Ref2 that is set to the reference setting terminal 72b of the clamp circuit 72 on the basis of the level of the signal clamped in the second clamp circuit 60. More specifically, the level computation circuit 62 calculates a value by subtracting an offset comparable to the reference value Ref1 from the signal output from the second clamp circuit 60 and outputs the value thus calculated as the reference value Ref2. The reference value Ref2 is input into the reference setting terminal 72b.

Figure 5:
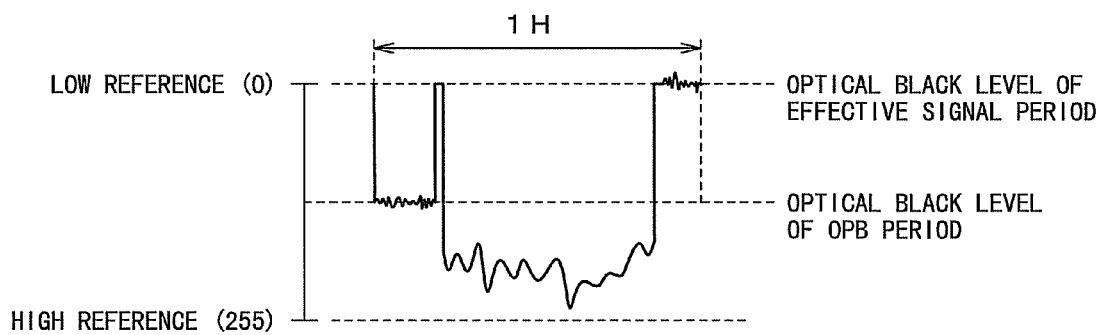
FIG. 5 is a view used to describe the clamp processing during an effective signal period according to the embodiment of the present invention.
Figure 6:
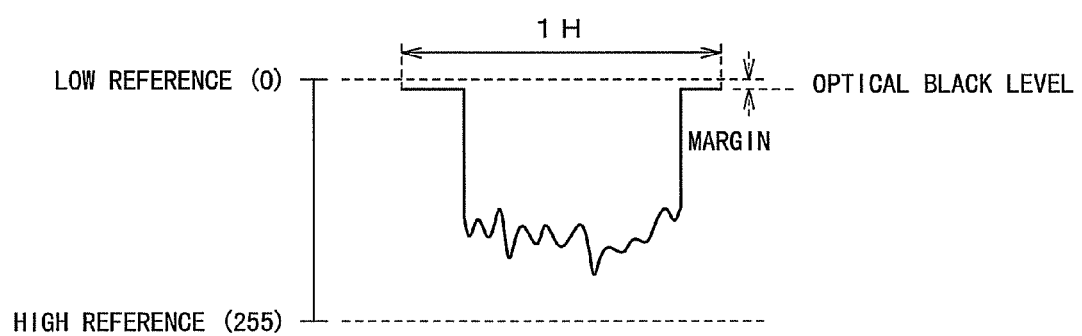
FIG. 6 is a view used to describe the clamp processing of an image signal in background art.
Figure 7:
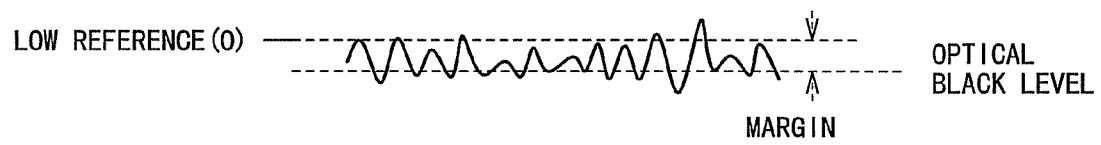
FIG. 7 is a view used to describe the clipping of the optical black level in background art.

In the second clamp circuit 60, the temporally leveled off optical black level is calculated over the horizontal optical black period. In this instance, as is shown in FIG. 4, the signal is offset on the basis of the reference value Ref1 first, and then analog clamping of the optical black level is performed in the clamp circuit 72. Hence, as some portion of a temporal variance of the optical black level is never clipped during leveling off the optical black level, it is possible to output an optical black level that has been leveled off appropriately. As is shown in FIG. 5, the reference value Ref2 for the clamping during the effective signal period is determined in the level computation circuit 62 according to the optical black level that has been leveled off appropriately as described above. It is thus possible to clamp the substantially effective image signal contained in the effective signal period according to the appropriate optical black level.

It should be appreciated that the invention is not limited to the embodiment described above, and the invention can be modified in various manners without deviating from the scope of the invention.

What is claimed is:

1. An image signal processing apparatus that applies processing on an image signal having a synchronization period, an optical black level period representing an optical black level, and an effective signal period representing an image signal, comprising:

a clamp circuit that clamps a value offset from the image signal on the basis of a first reference value during the optical black level period, and clamps the image signal on the basis of a second reference value different from the first reference value during the effective signal period, wherein the second reference value is found on the basis of a signal level clamped during the optical black level period; and the second reference value is calculated on the basis of an average value of a signal clamped during the optical black level period.

2. The image signal processing apparatus according to claim 1, further comprising:

an analog-to-digital converting circuit that converts a signal clamped in the clamp circuit from an analog form to a digital form, wherein the first reference value is set in such a manner that a signal in the optical black level period is clamped almost at a center of a dynamic range of the analog-to-digital converting circuit in the clamp circuit.

3. The image signal processing apparatus according to claim 1, further comprising:

a defect correction circuit that applies a defect correction to a signal output from the clamp circuit; and a second clamp circuit that clamps the image signal in the optical black level period after processing in the defect correction circuit, wherein the second reference value is found on the basis of a signal level clamped in the second clamp circuit.

4. An image signal processing apparatus that applies processing on an image signal having a synchronization period, an optical black level period representing an optical black level, and an effective signal period representing an image signal, comprising:
   a clamp circuit that clamps a value offset from the image signal on the basis of a first reference value during the optical black level period, and clamps the image signal on the basis of a second reference value different from the first reference value during the effective signal period, and
   an analog-to-digital converting circuit that converts a signal clamped in the clamp circuit from an analog form to a digital form,
   wherein the second reference value is found on the basis of a signal level clamped during the optical black level period; and
   wherein the first reference value is set in such a manner that a signal in the optical black level period is clamped almost at a center of a dynamic range of the analog-to-digital converting circuit in the clamp circuit.

5. An image signal processing apparatus that applies processing on an image signal having a synchronization period, an optical black level period representing an optical black level, and an effective signal period representing an image signal, comprising:
   a clamp circuit that clamps a value offset from the image signal on the basis of a first reference value during the optical black level period, and clamps the image signal on the basis of a second reference value different from the first reference value during the effective signal period;
   a defect correction circuit that applies a defect correction to a signal output from the clamp circuit; and
   a second clamp circuit that clamps the image signal in the optical black level period after processing in the defect correction circuit,
   wherein the second reference value is found on the basis of a signal level clamped during the optical black level period; and
   wherein the second reference value is found on the basis of a signal level clamped in the second clamp circuit.

6. An image signal processing method for applying processing to an image signal having a synchronization period, an optical black level period representing an optical black level, and an effective signal period representing the image signal, comprising:
   performing first clamp processing to clamp the image signal in the optical black level period by offsetting the image signal on the basis of a first reference value;
   performing second clamp processing to clamp the image signal in the effective signal period on the basis of a second reference value different from the first reference value; and
   performing reference value calculation processing to determine the second reference value on the basis of a signal level clamped by the first clamp processing;
   the second reference value is calculated on the basis of an average value of the signal clamped during the optical black level period in the reference value calculation processing.

7. An image signal processing method for applying processing to an image signal having a synchronization period, an optical black level period representing an optical black level, and an effective signal period representing the image signal, comprising:
   performing first clamp processing to clamp the image signal in the optical black level period by offsetting the image signal on the basis of a first reference value;
   performing second clamp processing to clamp the image signal in the effective signal period on the basis of a second reference value different from the first reference value;
   performing reference value calculation processing to determine the second reference value on the basis of a signal level clamped by the first clamp processing; and
   performing analog-to-digital conversion processing to convert the signal clamped in the first clamp processing and the second clamp processing from an analog form to a digital form,
   wherein the first reference value is set in such a manner that the signal clamped in the first clamp processing is clamped almost at a center of a dynamic range in the analog-to-digital converting processing.

8. An image signal processing method for applying processing to an image signal having a synchronization period, an optical black level period representing an optical black level, and an effective signal period representing the image signal, comprising:
   performing first clamp processing to clamp the image signal in the optical black level period by offsetting the image signal on the basis of a first reference value;
   performing second clamp processing to clamp the image signal in the effective signal period on the basis of a second reference value different from the first reference value;
   performing reference value calculation processing to determine the second reference value on the basis of a signal level clamped by the first clamp processing;
   performing defect correction processing to make a defect correction of the image signal having undergone the first clamp processing and the second clamp processing; and
   performing third clamp processing to clamp the image signal in the optical black level period having undergone the defect correction processing,
   wherein the second reference value is found on the basis of a signal level clamped by the third clamp processing.

* * * * *